United States Patent [19]

You

[11] Patent Number: 5,625,290
[45] Date of Patent: Apr. 29, 1997

[54] COMPLEX SUPERCONDUCTING QUANTUM INTERFERENCE DEVICE AND CIRCUIT

[75] Inventor: Hong K. You, San Gabriel, Calif.

[73] Assignee: Micontech, Inc., San Gabriel, Calif.

[21] Appl. No.: 467,413

[22] Filed: Jun. 6, 1995

Related U.S. Application Data

[63] Continuation-in-part of Ser. No. 200,641, Feb. 12, 1994.
[51] Int. Cl.$^6$ .................. G01R 33/02; G01R 33/035; H01L 29/06; H01L 39/22
[52] U.S. Cl. .................. 324/248; 257/31; 505/846
[58] Field of Search .................. 324/248; 257/31–36; 505/845, 846

[56] References Cited

U.S. PATENT DOCUMENTS 4,982,157  1/1991  Siefert .................. 324/248

*Primary Examiner*—Walter E. Snow
*Attorney, Agent, or Firm*—Hawes, Fischer & Dickinson

[57] ABSTRACT

The disclosed complex SQUID circuit achieves a high signal gain and high sensitivity for detecting a weak magnetic field. It is characterized by concentric loops of superconducting material, each loop incorporating preferably a pair of Josephson Junctions, the Josephson Junctions all aligned in a diameter generally transverse to the diameter defined by the connectors interconnecting the loops.

17 Claims, 3 Drawing Sheets

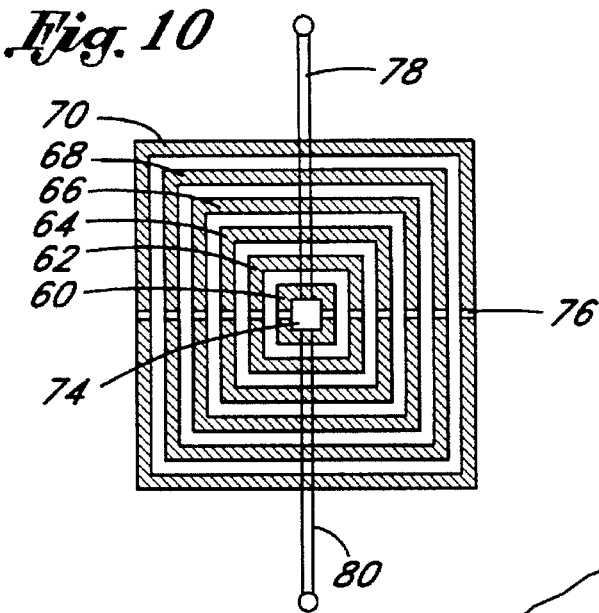
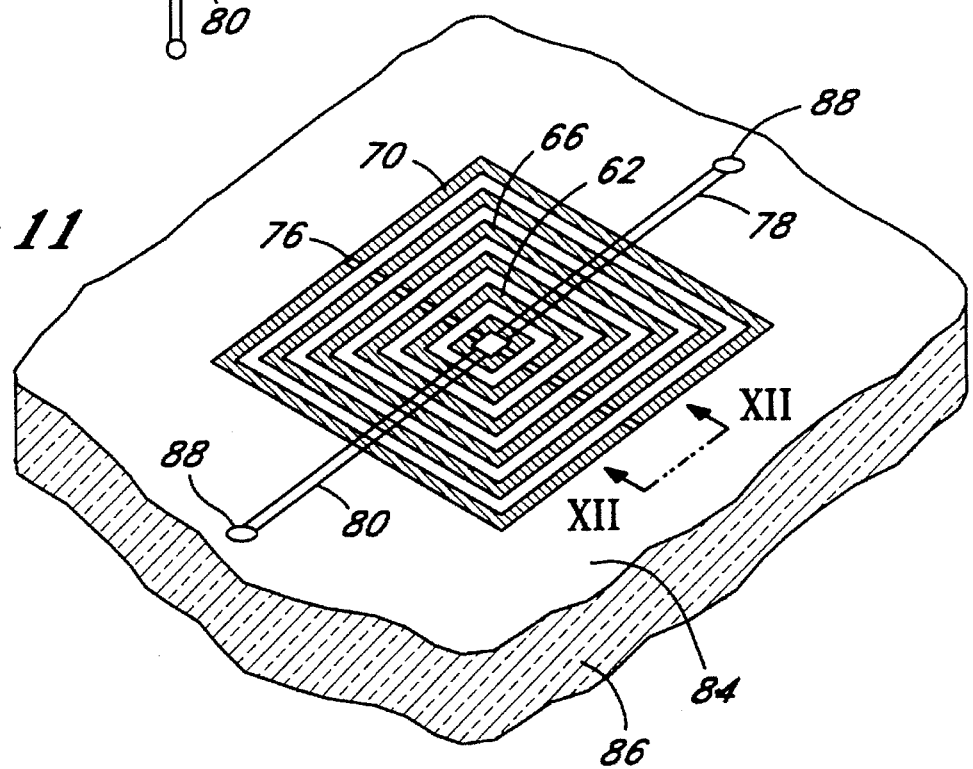
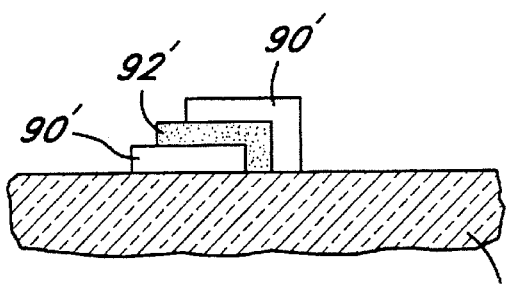

COMPLEX SUPERCONDUCTING QUANTUM INTERFERENCE DEVICE AND CIRCUIT

REFERENCE TO RELATED APPLICATION

This is a continuation-in-part of copending U.S. patent application Ser. No. 08/200,641 filed by the present inventor on Feb. 12, 1994, which is fully incorporated herein by this reference.

BACKGROUND OF THE INVENTION

1. Field of the Invention

This invention relates in general to superconducting quantum interference devices, known as SQUIDs, used for measurement of a magnetic flux. In particular, it relates a new, complex type of superconducting quantum interference device and circuit.

2. Background Art

Superconducting QUantum Interference Devices (SQUIDs) are the most sensitive magnetic field detector known. They involve several quantum phenomena, namely, Josephson tunneling, flux quantization, and quantum interference. A SQUID can be configured to measure a minute change of any physical quantity that can be converted to a flux, such as voltage, current or magnetic field; i.e. it is extremely versatile, being able to measure the magnetic field produced by any of various field sources. Such devices can have energy resolution capabilities approaching the quantum limit. As a result, the SQUID has been used in a wide variety of applications, ranging from medical diagnosis to scientific research, and from non-destructive evaluation to routine measurements of magnetic properties of materials.

There are two kinds of SQUIDs. The first, the dc SQUID, usually consists of two Josephson Junctions connected in parallel on a superconducting loop. The second, the rf SQUID, usually involves a single Josephson Junction on a superconducting loop. In both types, the Josephson Junction is formed by a thin insulating barrier or layer between two pieces or sections of the superconductive loop. The insulating barrier's thickness and cross-section are so very much smaller than the dimensions of the complete circuit loop that electron pairs can tunnel from one side of the Junction to the other without transfer of energy; i.e. when the thickness of the Josephson Junction reaches the order of the coherence length of electron pairs, a superconducting tunnelling current occurs, which is a striking evidence for the existence of long-range order in the superconducting state. This makes it possible to have current flow in the absence of an applied voltage. Particularly in the dc, two Junction loop SQUID, the current produced by interference oscillates with changes in the magnetic field.

Typically, a SQUID produces an output voltage which varies in a periodic manner in response to a small input flux. The extreme sensitivity of such a device derives from the fact that the SQUID can resolve a small fraction of $\phi_0$, the quantum of magnetic flux, while $\phi_0$ is itself a very small quantity. Both dc and rf SQUIDs are used, and can be used, as sensors in a wide variety of instruments.

A multi-channel array of SQUIDs was first proposed by Feynman in *The Feynman Lecturers on Physics-Quantum Mechanics*, Addison Wesley Publishing Co., 1965, Ch. 21, and pursued by various research groups; see J. E. Zimmerman and A. H. Silver, Macroscopic Quantum Interference Effects Through Superconducting Point Contacts, Physical Review, Vol. 141, No. 1, January 1966, and W. H. Chang, Interferometric Measurement of Magnetic Flux, IBM Technical Disclosure Bulletin, Vol. 25, No. 6, November 1982, pp. 2940–2941.

In general, a SQUID can be used to sense a magnetic field directly. However, in many circumstances when this is not a practical arrangement, the SQUID is magnetically coupled to the field by means of a flux transformer. The flux transformer is a closed superconducting circuit which has a primary for sensing the field and a secondary which is magnetically coupled to the SQUID. The principle reason is simply the need to minimize detection of ambient noise. A detection coil responds to the applied field regardless of the distance of its source. With the detection coil of first order or higher, it makes much less demands with regard to screening. The signal thus generated in the SQUID is then fed via electrical leads of normal conducting material to be connected to electronic circuitry for further processing. For some applications, it is of advantage to integrate the external circuit along with the SQUID on a single substrate. There are also situations in which it is possible to configure the SQUID itself to perform some particular function, such as in a magnetometer, gradiometer, susceptometer, or voltmeter. More detailed principles can be found in earlier reviews by Clarke, SQUIDs: Principles, Noise, and Applications, in Superconducting Devices, edited by Steven T. Ruggiero and David A. Rudman, Academic Press, Inc., 1990, pp. 51–99, and Clarke, SQUIDs: Theory and Practice in the New Superconducting Electronics, edited by H. Weinstock and R. W. Ralston, Kluwer Academic Publishers, 1993.

Up to late 1986, it was believed that superconductivity above a temperature of 40 degrees kelvin (k) was not possible, according to the BCS theory. A breakthrough in critical temperature in superconductivity was made in November 1986, by Bednorz and Muller; see J. G. Bendnorz and K. Alex Muller, Z. Phys., B 64, 189, 1986. Now the transition temperatures of new superconductors reach well above one hundred degrees kelvin; see Hasen et al., Phys. Rev. Lett. 60, 1657, 1988, and Parkin et al. Phys. Rev. 60, 2539, 1988. Since the discovery of High-Tc Superconductors, the basic mechanism for high-Tc superconductivity has been far from understood, which may well be somewhat different from the mechanism of low-Tc superconductivity, if not completely different. Although today we have very limited understanding of high-Tc materials, it has generally been accepted that SQUIDs are the most promising application for these materials. With the critical temperature of High-Tc Superconductor (HTSC) now above the boiling point of liquid nitrogen, the HTSC SQUID can operate in liquid nitrogen, which is much less expensive cryogen with a much higher heat capacity as compared to liquid helium. This drastically reduces the operating cost for the device. Such a High-Tc SQUID certainly is more versatile, feasible and economically practical in application.

Unfortunately, realization of this application has been hampered due to a number of unsolved technical challenges.

The first problem is lack of a reliable technique for fabricating the Josephson Junction; this is the essential element of a vast majority of traditional superconducting electronics. A classic Josephson Junction is extremely difficult to fabricate with HTSC. The main reason for this problem is the very small coherence length of the oxide superconductors which is typically on the order of 1 nm. Hence, to fabricate a good Junction it is necessary to have a S-I interface on an atomic scale. The alternative weak link Junction structure, relying on such linear dimensions, is very hard to fabricate even with the most sophisticated lithographic tools available today. Though dc-SQUIDs fabricated with grain boundaries have shown some substantial progress, it is not clear that such a technique can be extended to producing complex circuits.

The second problem concerns the 1/f noise level in HTSC SQUIDs; it is very high compared with that of low temperature SQUIDs. This noise clearly originates in the Josephson elements, and not in the epitaxial HTSC films, for reasons that are not understood.

The third problem is that the characteristic voltage is low, which might be due to the weak tunnelling current. This further lowers the signal-to-noise ratio.

It is difficult to imagine that HTSC SQUIDs will have significant practical applications unless there is a major improvement in their signal-to-noise ratio and sensitivity. In order to achieve a high-performance SQUID with high-Tc superconductors, it is important to enhance the magnitude of the signal gain and the S/N ratio. Equally important is to improve the pattern of oscillation, i.e. the slope of the curve.

Accordingly, an object of the present invention is to provide a SQUID design, particularly a HTSC SQUID design, which will achieve a high current gain, high signal-to-noise ratio and high sensitivity.

These and other objects of the invention will be apparent to those of ordinary skill in this field from the following description of preferred embodiments.

SUMMARY OF THE INVENTION

The new SQUID design is based on two different schemes. The first one changes the structure of the Josephson Junction in the loop. The second provides for a particularly advantageous used either separately or in combination. The fabrication of these SQUIDs should prove to be both reproducible and reliable.

Preferably, the SQUID device of the present invention is formed on the face of a substrate. It includes a loop of superconducting material of a first width, and a Josephson Junction formed in the loop by pads of superconducting material overlying one another and separated by a layer of insulating material, the pads each having a second width substantially identical to one another and larger than the first width. The layer of insulating material may be substantially larger than the pads; in fact, the layer of insulating material may extend from one pair of pads across the loop to the other pair of pads, if desired.

Preferably the SQUID device of the present invention is configured as a plurality of concentric loops on the face of the substrate, the loops being equally spaced from one another and connected in parallel by radial conductors extending on a common diameter away from the center of the loops, this diameter being preferably perpendicular to a second diameter along which is positioned the Josephson Junctions in the succession of loops. Such an arrangement offers a high current gain, high signal to noise ratio and high sensitivity.

BRIEF DESCRIPTION OF THE DRAWINGS

The invention will be further described in connection with the accompanying drawings in which:

FIG. 10 is a schematic illustration of an improved SQUID circuit of the present invention;

FIG. 11 is a schematic illustration of the SQUID circuit shown in FIG. 10 on a substrate;

FIG. 12 is a cross-sectional view taken on lines XII—XII of FIG. 11 showing one construction of a SQUID element which may be employed in this circuit; and FIG. 13 is a cross-sectional view, similar to FIG. 12, showing another construction of a SQUID element.

DETAILED DESCRIPTION

Figure 1:
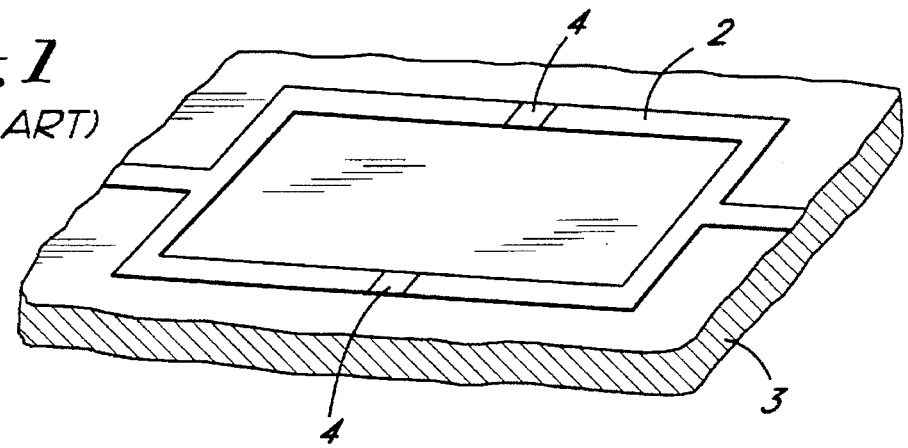
FIG. 1 is a schematic illustration of a typical DC SQUID of the prior art.

The present invention provides a SQUID device and design, particularly a HTSC SQUID design, that achieves high current gain, high signal-to-noise ratio and high sensitivity. Its significance can best be appreciated by comparing it first to a typical dc SQUID, such as the dc SQUID construction shown in FIG. 1. As there are illustrated, a loop 2 of superconducting material on the face of substrate 3 is broken at Josephson Junctions 4 typically on opposed sides of the loop, each Josephson Junction being formed by a thin insulating barrier or layer. Such a construction shown is, for example, in Takagi et al. U.S. Pat. No. 5,077,266 issued Dec. 31, 1991 and titled "Method of Forming Weak-Link Josephson Junction." Connectors 6 extend from opposed sides of the loop to permit the current flowing through the loop to be detected in a well-known fashion. A typical material used to fabricate the connectors 6 is yitrium barium copper oxide ($YBa_2Cu_3O_7$). Typically the Josephson Junction is of a dimension (width and height) comparable to these dimensions of the superconductor, but its length (or thickness) is small. This complicates fabrication of the Junction and appears to contribute significantly to the problems associated with HTSC SQUIDs.

Figure 2:
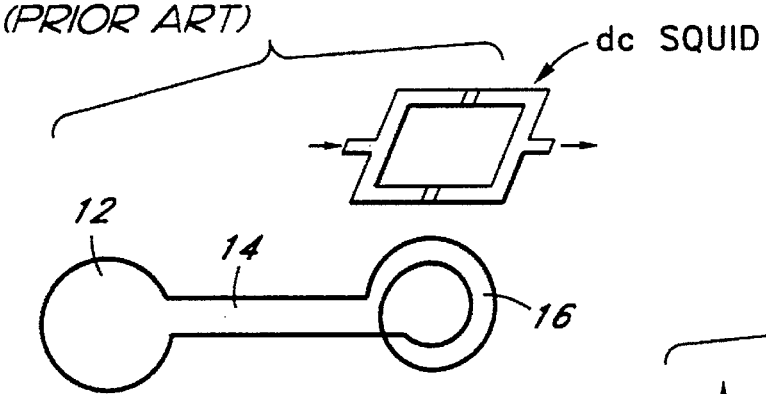
FIG. 2 is a schematic illustration of a typical DC SQUID magnetometer of the prior art.

SQUID elements have been used in a variety of devices. For example, as indicated in FIG. 2 it is known to place a SQUID element within a low temperature environment and to translate to that environment an external magnetic field using an external pick-up loop 12 connected by conductors 14 to an internal input coil 16 adjacent to the SQUID. Thus, a magnetic field encountered by pick-loop 12 will be translated to a generated magnetic field by input coil 16 which in turn will effect the SQUID, thereby constituting the sensor of a magnetometer.

Figure 3:
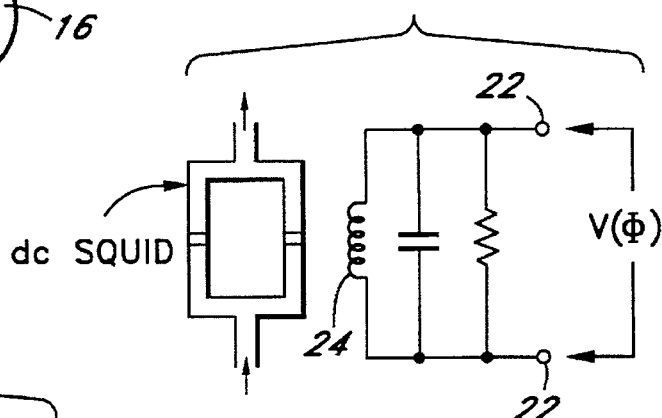
FIG. 3 is a schematic illustration of a typical voltmeter SQUID of the prior art.

As shown in FIG. 3, a SQUID device also may be employed in a voltmeter. In general, such a construction provides a pair of terminals 22 to which the voltage may be applied, these terminals being connected across a resistor and capacitor in parallel with one another to an input coil 24 which is adjacent the SQUID thereby applying the magnetic field it generates to the SQUID. This magnetic field will be proportional to the voltage applied across terminals 22 which in turn will cause a corresponding signal in the SQUID.

Figure 4:
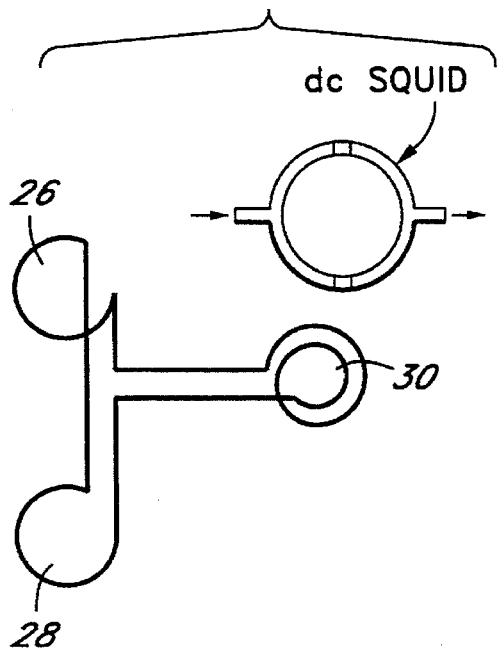
FIG. 4 is a schematic illustration of a typical gradiometer SQUID of the prior art.

A SQUID device also is can be employed in a gradiometer as shown in FIG. 4, the device in this arrangement sensing the difference or gradient in a magnetic field between a first pick-up loop 26 and a second pick-up loop 28 which are both connected as indicated to an input coil 30. Thus, the difference in magnetic fields encountered by the two pick-up loops will produce a different magnetic field that is sensed by the SQUID causing it to produce a corresponding signal.

Figure 5:
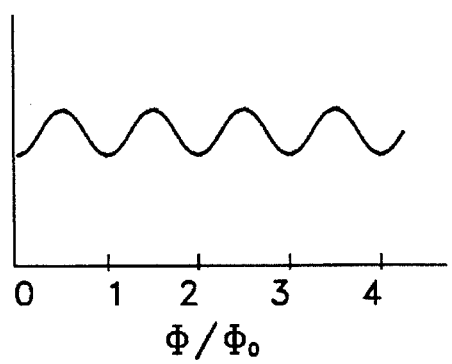
FIG. 5 is a schematic illustration of an output voltage characteristic of a SQUID.

SQUID elements are known to produce a characteristic voltage versus flux signal in response to an implied field at a constant bias current. This voltage varies in an oscillation pattern, as shown in FIG. 5 with a period of magnetic flux.

Figure 6:
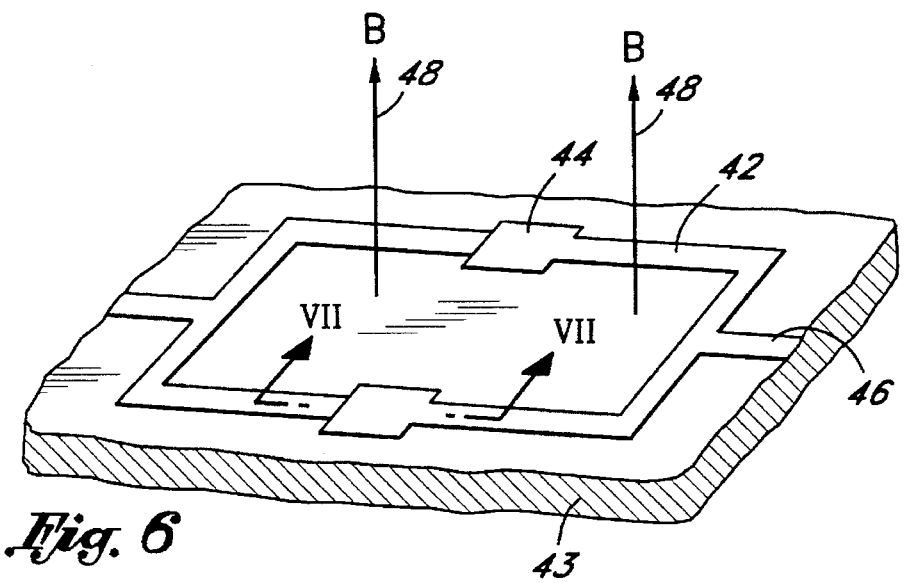
FIG. 6 is a schematic illustration of an improved SQUID constructed in accordance with the present invention.
Figure 7:
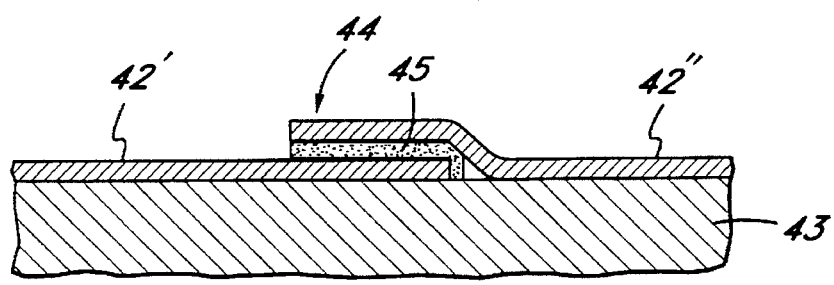
FIG. 7 is a cross-sectional view taken on lines VII—VII of FIG. 6.

Shown in FIGS. 6 and 7 is a preferred form of SQUID constructed in accordance with the present invention. It consists of a loop 42 of superconducting material on a substrate 43, the loop being broken, preferably on opposed sides, and enlarged to form pads 44. Between overlapping pads 44 is provided the insulating material 45. Thus, by this construction the characteristics of the Josephson Junction are not limited in size to the size of the superconducting loop, but rather may be adjusted as desired to achieve a Junction of the preferred characteristics irrespective of the size of the superconducting loop. Connectors 46 extend from either side of the loop. Thus, on application of a flux B in any direction, such as that indicated by arrows 48, and particularly upon changes in that flux, changes in the superconducting current flowing in loop 42 will occur and may be sensed on correctors 46.

To fabricate the form of SQUID shown in FIG. 6, as shown in FIG. 7 a superconducting thin film 42' is deposited on the face of a substrate, and is patterned to obtain a half SQUID circuit with two enlarged terminal pads 44. Then an insulating layer 45 is formed on the enlarged terminal pads with the thickness controlled to be in the range compatible to the coherence length scale; this can be achieved by conventional techniques without difficulty.

Then a superconducting thin film 42" is deposited to cover this barrier layer and is patterned to obtain the other half of the SQUID circuit with enlarged terminal pads exactly on the top of terminal pads of film 42'. The Josephson Junction is formed by the two enlarged terminal pads 44 of substantially the same size and coupled by an insulating layer 45. This geometry is totally different from that of standard end-to-end Josephson Junctions. The tunnelling current in this SQUID is virtually perpendicular to the supercurrent in the loop, which is entirely different from that in a conventional SQUID. This planar type Josephson Junction offers significant advantages in the process of fabrication, for it is relatively easy to apply and control. Also, the cross-sectional area of the active barrier Junction is obviously many orders of magnitude greater than that of prior art constructions. This leads to additional advantages for a SQUID which enable the SQUID construction of this invention to enhance the Junction current enormously.

Figure 8:
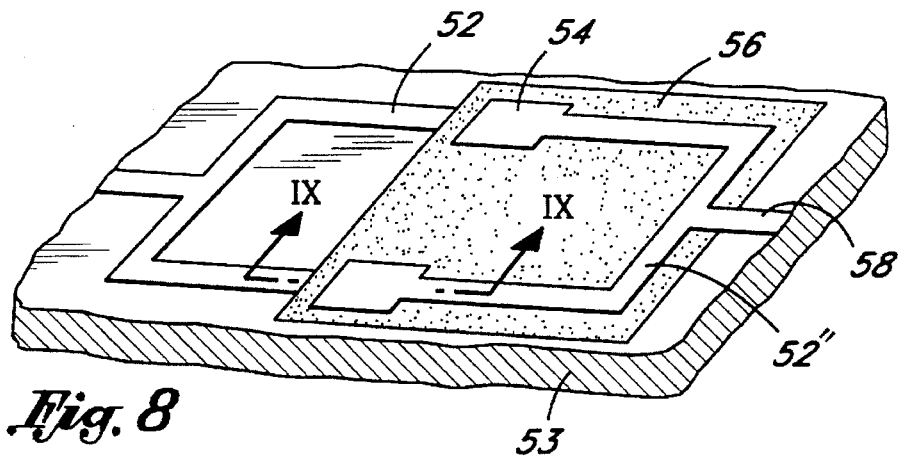
FIG. 8 is a schematic illustration of another construction of the improved SQUID of the present invention.

Shown in FIG. 8 is another construction of SQUID employing the principals of the present invention. In this construction, the superconducting loop 52 on substrate 53 is enlarged to provide pads 54 between which is the insulating material 56. In this construction, however, the material does not just cover the pad areas, but rather extends across the face of the planar element. The remaining portion 52" of the superconducting circuit is applied on top of this pad to achieve the other half of the superconducting loop. Connectors 58 extend from opposed sides of the loop.

Figure 9:
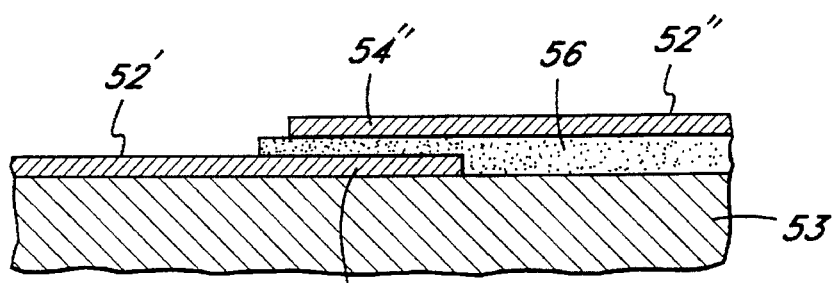
FIG. 9 is a cross-sectional view taken on lines IX—IX of FIG. 8.

To fabricate this construction, as shown in FIG. 9 preferably after the first half 52' of the superconducting loop is applied to the substrate. Then, instead of an insulating layer being formed only on the top of the enlarged terminal pads, an insulating layer 56 covering the two bottom enlarged terminal pads 54' is formed to extend over half of the substrate; its thickness is in the range of coherence length. Then a superconducting layer 52" is deposited on the insulating layer 56, and is pattern to obtain the other half loop of the SQUID with enlarged terminal pads 54" exactly on overlying pads 54'.

Basically, this provides two half SQUID loops on two separate superconducting film layers coupled by an insulating layer. The size of the insulating layer is not critical as long as it covers the enlarged terminal pads. This construction avoids the need to accurately apply or define the insulating layer, further simplifying fabrication of the SQUID of the present invention.

These SQUID constructions can be advantageously employed in various circuit configurations such as those circuits shown in FIGS. 2, 3 and 4 for a magnetometer, a voltmeter or a gradiometer.

The SQUID loops previously described may be cascaded or multiplied in any of various ways. In general, such cascading is intended to increase the combined output of the cascaded loops in response to a very weak magnetic field, for as previously stated SQUID circuit and loops are often used to sense exceedingly weak magnetic fields. In general, an exceedingly weak magnetic field may be thought of as a very weak magnetic flux line surrounded by a few still weaker echoes of that line. As this flux line interacts with a SQUID loop or circuit, it will result in a current flow across the Josephson Junctions of the circuit. The current flow will be the greatest for the junctions nearest to the magnetic flux line, and significantly less for Josephson Junctions spaced from that flux line. Many previous circuit arrays of SQUID loops place the loops in an adjacent or side-by-side relationship. Thus, as the magnetic flux line moves relative to this array, it will produce a maximum current flow in various successive Junctions of the array. Many Josephson Junction or SQUID circuits combine this current flow such that as the interaction of the flux line sweeps across the array the decrease in current flow of a previous loop will be offset by an increase in current flow in the current loop, thus resulting in a substantially uniform signal as the flux line traverses at least the center portion of the array.

It is often desirable to not smear the signal generation effect of the flux line as it moves across the array, but rather to construct or interconnect the SQUID circuits of the array in a fashion designed to maximize the output of the circuit on resulting from the flux line when it is substantially centered on the array, and to minimize the result in the smearing of this signal as the flux line moves beyond this mid-point. In other words, it is often desirable to provide a current flow output from the SQUID circuit that closely tracks the location of the flux line relative to the array and also indicates with sensitivity the strength of that flux line.

A preferred circuit for achieving this result is shown in FIG. 10, and as applied to the face of a substrate in FIG. 11. In general, it consists of a plurality or multiplicity of nested SQUID circuits which for convenience have been labelled 60, 62, 64, 66, 68 and 70. These SQUID circuits are nested (or are concentric) with one another, all being centered on an imaginary point 74. Each SQUID circuit includes a pair of Josephson Junctions along a line or diameter across the concentric SQUID circuits. These Josephson Junctions generally are indicated by reference numeral 76. The concentric SQUID circuits are interconnected by a set of connectors 78 and 80, these connectors preferably being superconductive and also lying on a common line across the concentric SQUID circuits, this line or diameter being substantially perpendicular to the line defined by Josephson Junctions 76. Thus, as a line of magnetic flux moves across the circuit, in an ideal situation it might pass along a diameter, crossing imaginary center point 74 then moving out of the concentric SQUID circuits along the same diameter. The current output (or signal) produced by the Josephson Junctions in general will be directly related to the strength of the magnetic flux line and its proximity to the Josephson Junctions. A maximum output will be achieved when the magnetic flux line is at the center point 74 of the circuits. This output will rise as the flux line moves towards that center, and decrease as it moves away from that center. In contrast, many of the SQUID circuits proposed or employed by others in this field significantly fail to produce a distinct output peak when the flux line is centered on the array, but instead smear the output as the flux line moves across the array.

Preferably this SQUID circuit is applied to the face 84 of substrate 86, as shown in FIG. 11. The connectors 78 and 80 each terminate in a contact pad 88.

As shown in FIG. 12, the Josephson Junction elements of this SQUID circuit may be formed by interrupting a superconductor 90 to provide an insulating layer 92. This insulating layer may be of a width substantially equal to the width of the superconductor 90, as often done in previous constructions, or it may be enlarged for the reasons previously described in this detailed description.

In general, the concentric SQUID circuit preferred by the present invention provides symmetrical concentric loops with a common center, thereby enhancing the effect of a magnetic field on the signal output, especially the effect of a non-uniform or discrete magnetic field. The concentric multiplicity of SQUID loop circuits assists significantly in keeping the signals produced on connectors 78 and 80 in coherent phases. This arrangement also increases the effective area of the loops and circuit, while keeping the inductance small for each loop. It therefore provides a considerably greater pattern slope and amplitude for the output voltage over that provided by such arrangements as shown in FIGS. 1–4 and diagrammatically illustrated in FIG. 5.

FIG. 13 illustrates a different construction of the Josephson Junction, one in which the insulating layer 92' not only engages the end of the superconducting loop 90' but also overlies its end area thereby increasing the effective size of the Josephson Junction in superconductor 90', especially when this construction is coupled with one which maximizes the width of the Josephson Junction. By making it wider than the width of superconductor 90', a maximum signal output can be achieved for a given strength of magnetic fields or magnetic flux line.

The Josephson Junction employed in this circuit may use any of various constructions or geometry, such as weak link, grain boundary or step edge geometry, as shown in DiLorio et al. U.S. Pat. No. 5,134,117, dated Jul. 28, 1992, for a HIGH TEMPERATURE MICROBRIDGE SUPERCONDUCTOR DEVICE UTILIZING STEPPED EDGE-TO-EDGE SNS JUNCTION, Shinada U.S. Pat. No. 5,227,645, dated Jul. 13, 1993 for a DC SQUID ELEMENT WITH QUASI-PLANAR-TYPE JOSEPHSON JUNCTION, Marsden U.S. Pat. No. 5,202,630, dated Apr. 13, 1993, for a THIN FILM SQUID DETECTOR INCLUDING A LOOP RESPONSIVE TO A MAGNETIC FLUX COMPONENT LYING IN THE PLANE OF THE THIN FILM, Marsden U.S. Pat. No. 5,142,229, dated Aug. 25, 1992, for THIN FILM ... SQUID DETECTORS, Takagi et al. U.S. Pat. No. 5,077,266, dated Dec. 31, 1991, for a METHOD OF FORMING WEAK-LINK JOSEPHSON JUNCTION, AND SUPERCONDUCTING DEVICE EMPLOYING THE JUNCTION, Kapitulnik U.S. Pat. No. 5,219,826, dated Jun. 15, 1993, for a SUPERCONDUCTING JUNCTIONS AND METHOD OF MAKING SAME, Young et al. U.S. Pat. No. 4,418,095, dated Nov. 29, 1983, for a METHOD OF MAKING PLANARIZED JOSEPHSON JUNCTION DEVICES, Hed U.S. Pat. No. 5,171,732, dated Dec. 15, 1992, for a METHOD OF MAKING A JOSEPHSON JUNCTION, Ishibashi et al. U.S. Pat. No. 4,888,622, dated Dec. 19, 1989, for a SUPERCONDUCTOR ELECTRON DEVICE, Wang et al. U.S. Pat. No. 4,509,146, dated Apr. 2, 1985, for a HIGH DENSITY JOSEPHSON JUNCTION MEMORY CIRCUIT, or Tarutani et al. U.S. Pat. No. 4,319,256, dated Mar. 9, 1982, for a JOSEPHSON JUNCTION ELEMENT.

In summary, the preferred SQUID circuit of the present invention incudes a plurality of concentric superconducting loops, each superconducting loop consisting of two Josephson Junctions preferably aligned with one another on a diameter across the loops that is perpendicular to the diameter defined by the interconnecting conductors of the circuit. The Josephson Junction elements in this arrangement can be a thin barrier structure, a point contact structure, a microbridge or a three-layer structure; indeed, the invention is equally applicable to all sorts of Josephson Junction elements. Appropriate substrates include sapphire and magnesium oxide. Multiple concentric non-equally sized loops are provided and are preferably formed on the same superconducting layer. Of course, they could also be formed on different superconducting layers, if desired.

The sensitivity of a SQUID device or circuit is determined from the equation:

$$\phi = B \cdot A$$

where $\phi$ is the flux, B the magnetic field strength and A the area. Thus, the sensitivity of the SQUID is increased by increasing the area for a given flux change ($\Delta \phi$); the larger the area, the smaller the flux change which can be detected.

But the largest area that can be used is limited by the self-inductance (L) of the SQUID. Specifically:

$$\Delta I_c = \phi_o \div L$$

The larger the area, then the smaller the signal change; the FIG. 5 fluctuations flatten with increasing area. Thus, SQUID device and circuit design don't use large areas, and have to otherwise try to deal with low S/N ratios and a reduced sensitivity.

The present design effectively enables a large area (A) to be used in a highly sensitive device and circuit, for it breaks up what would otherwise be the large area into discrete SQUID elements. Among other things, this arrangement achieves an excellent match for the input coil 16 or 30 used to transfer or translate an external field to a SQUID device or circuit contained within a cryogenic environment or chamber. Because of its reduced, or minimum, size it minimizes the cryogenic chamber's size. Whereas other SQUID designs and circuits as a practical matter are limited to about six loops, because of the area they require, the present design is not so limited. For these reasons, too, the present design enhances the characteristics of the resulting device and circuit.

While this device or circuit is designed for high-Tc superconductors such as YBCO operating in a liquid nitrogen coolant, it also can be employed using low-Tc superconductors. The loops of course can be of any or various shapes other than that illustrated, such as for example, being concentric circles rather than in concentric squares. Each of the concentric loops preferably is separated from adjacent loops by equal spaces, although in certain applications it may be advantageous to vary the space between adjacent loops, or even to vary their centerpoint while maintaining the surrounding relationship of each loop with the inwardly adjacent loop. The conducting lines 78 and 80 can be on the same layer as the loops, and formed by either normal conductors (such as gold), or by a superconductive material. Also, each loop may have a separate conducting line or can be made on different layers. With this loop arrangement, an ultra high sensitivity and accuracy of measurement can be achieved as the result of the greatly enhanced signal gain and improved response characteristics for the device, rendering it especially suitable for neuromagnetism and geophysical magnetism applications.

While preferred forms of the present invention have been illustrated and described, other forms will be readily apparent to those of ordinary skill in this field. Accordingly, the invention is set forth in the following claims:

I claim:

1. A SQUID device including:
    a plurality of loops of superconducting material, the loops being concentric with one another,
    a plurality of Josephson Junctions in each loop of superconducting material, each Josephson Junction being formed in a segment of its loop, each Josephson Junction lying substantially transverse to its loop segment, the Josephson Junctions being substantially aligned such that they all lie in substantially a straight line extending across the concentric loops, and
    means electrically connecting the loops to produce an output proportional to the current flow in the superconducting loops.

2. A SQUID device as set forth in claim 1, in which each loop includes a pair of Josephson Junctions.

3. A SQUID device as set forth in claim 1, in which the Josephson Junctions for each loop are on opposed arms of the loop.

4. A SQUID device as set forth in claim 1 in which each Josephson Junction is formed from an insulating material having a cross-sectional area that is substantially larger than the cross-sectional area of the adjacent portion of the loop of superconducting material.

5. A SQUID device as set forth in claim 1, in which the means electrically connecting the concentric loops includes connectors extending across the concentric loops in a line substantially perpendicular to the line defined by the Josephson Junctions.

6. A SQUID device as set forth in claim 1, in which there are at least three concentric loops of superconducting material.

7. A SQUID device as set forth in claim 1, in which the concentric loops are separated from one another by equal spacing.

8. A SQUID device as set forth in claim 1, in which the concentric loops are each substantially square in shape and centered on the same point.

9. A SQUID device as set forth in claim 1, in which the means electrically connecting the loops is also a superconducting material.

10. A SQUID device as set forth in claim 1 in which each of said plurality of Josephson Junctions is formed as pads of superconducting material separated by a pad of insulating material.

11. A SQUID device as set forth in claim 10 in which the width of said pad of insulating material forming each of said plurality of Josephson Junctions is greater than the width of the pads of superconducting material forming each of said Josephson Junctions.

12. A SQUID device as set forth in claim 10 in which the widths of the pads of superconducting material forming each of said plurality of Josephson Junctions are substantially the same size.

13. A SQUID device as set forth in claim 10 in which the pad of insulating material forming each of said plurality of Josephson Junctions is sandwiched between a pair of pads of superconducting material.

14. A SQUID device including:
    a plurality of loops of superconducting material being arranged in concentric alignment with one another;
    a plurality of Josephson Junctions in each of said plurality of loops of superconducting material, each Josephson Junction being formed in a segment of its respective loop and each Josephson Junction lying substantially transverse to the direction of its loop segment, said plurality of Josephson Junctions being aligned with one another such that they all lie in substantially a straight line extending across said plurality of concentric loops; and
    means electrically connecting said plurality of concentric loops to produce an output proportional to the current flow in the superconducting material of said plurality of loops.

15. A SQUID device as set forth in claim 14 in which each of said plurality of loops includes a pair of said Josephson Junctions that are arranged opposite one another.

16. A SQUID device as set forth in claim 14 in which the means electrically connecting said plurality of concentric loops includes connectors extending across said loops in a line that is substantially perpendicular to the straight line in which said plurality of Josephson Junctions lie.

17. A SQUID device as set forth in claim 14 in which said plurality of concentric loops are substantially square in shape and separated from one another by equal spacing.

* * * * *